(12) United States Patent
Ikubo et al.

(10) Patent No.: US 8,241,423 B2
(45) Date of Patent: Aug. 14, 2012

(54) SILICON SINGLE CRYSTAL SUBSTRATE AND MANUFACTURE THEREOF

(75) Inventors: Eisyun Ikubo, Hiratsuka (JP); Naoto Hirano, Hiratsuka (JP); Moritaka Iwasa, Hiratsuka (JP)

(73) Assignee: Sumco Techxiv Corporation, Hiratsuka-shi, Kanagawa (JP)

( * ) Notice: Subject to any disclaimer, the term of this patent is extended or adjusted under 35 U.S.C. 154(b) by 1355 days.

(21) Appl. No.: 11/863,861

(22) Filed: Sep. 28, 2007

(65) Prior Publication Data
US 2008/0224270 A1 Sep. 18, 2008

(30) Foreign Application Priority Data
Sep. 29, 2006 (JP) .................................. 2006-270065

(51) Int. Cl.
*C30B 21/04* (2006.01)
(52) U.S. Cl. ............ 117/97; 117/100; 117/103; 117/104
(58) Field of Classification Search .................. 117/97, 117/100, 103, 104
See application file for complete search history.

(56) References Cited

U.S. PATENT DOCUMENTS

| | | | | |
|---|---|---|---|---|
| 5,737,229 A | * | 4/1998 | Bhushan | 700/117 |
| 5,830,556 A | * | 11/1998 | Miyazaki et al. | 428/141 |

FOREIGN PATENT DOCUMENTS

| | | |
|---|---|---|
| JP | 62-128520 | 6/1987 |
| JP | A-H04-096247 | 3/1992 |
| JP | A-H07-082997 | 3/1995 |
| JP | 07-235534 | 9/1995 |
| JP | A-H10-070080 | 3/1998 |

OTHER PUBLICATIONS

Tetsujirou, JP S62-128520 A, 1987, Partially translated.*
Office Action dated, Aug. 18, 2011, of corresponding Japanese Application No. 2007-254100.

* cited by examiner

*Primary Examiner* — Bob M Kunemund
(74) *Attorney, Agent, or Firm* — Alston & Bird LLP

(57) ABSTRACT

A semiconductor wafer for an epitaxial growth is disclosed comprising: a main face on which a vapor phase epitaxial layer grows; a back face provided on an opposite side of the wafer; a main chamfered part along a circumferential edge where the main face and a side face of the wafer meet; and a back chamfered part along a circumferential edge where the back face and the side face meet is provided. After a CVD layer formation process is conducted to form a layer at least on the back face and the back chamfered part, a machining process is conducted on the main face to remove a CVD layer at least partially formed thereon so as to polish the main face to a mirror finished surface with a maximum height of profile (Rz) not exceeding 0.3 μm.

4 Claims, 11 Drawing Sheets

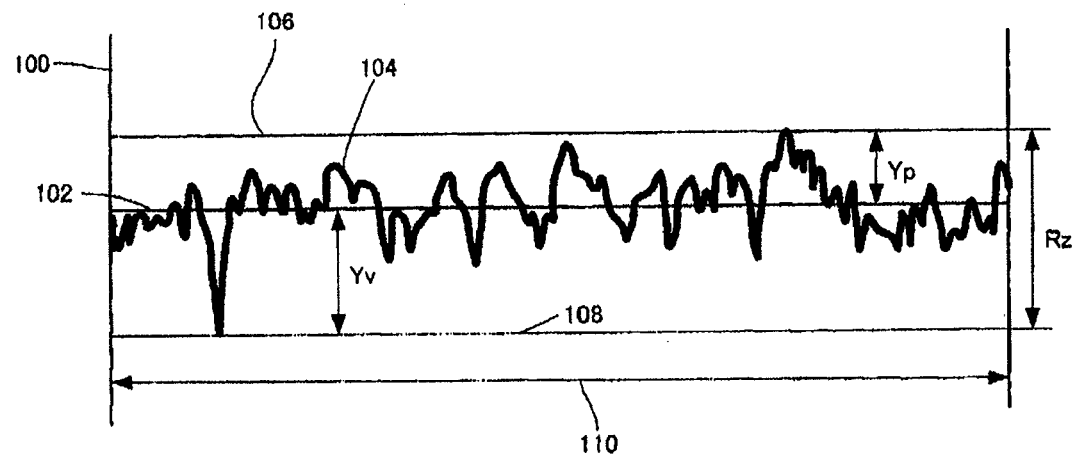
Fig. 3 -- Prior Art --
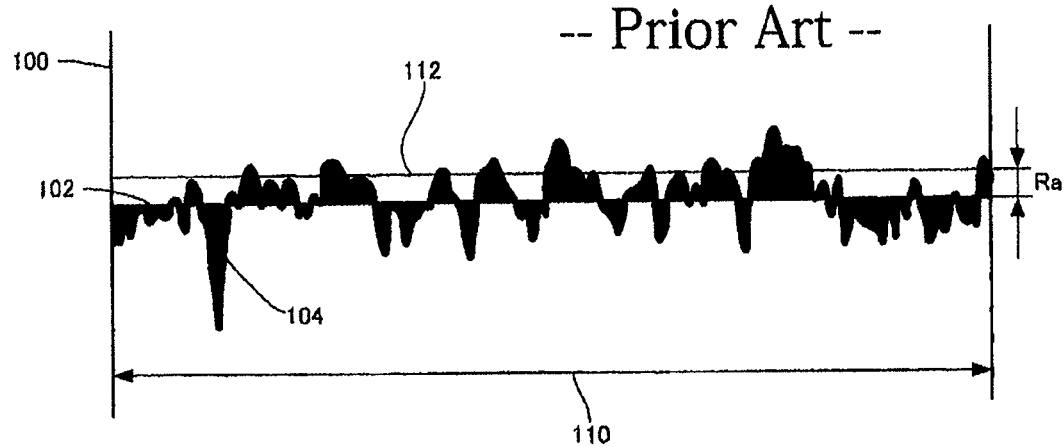
Fig. 4 -- Prior Art --

*-- Prior Art --*

*-- Prior Art --*

*-- Prior Art --*

*-- Prior Art --*

Fig. 6A
-- Prior Art --
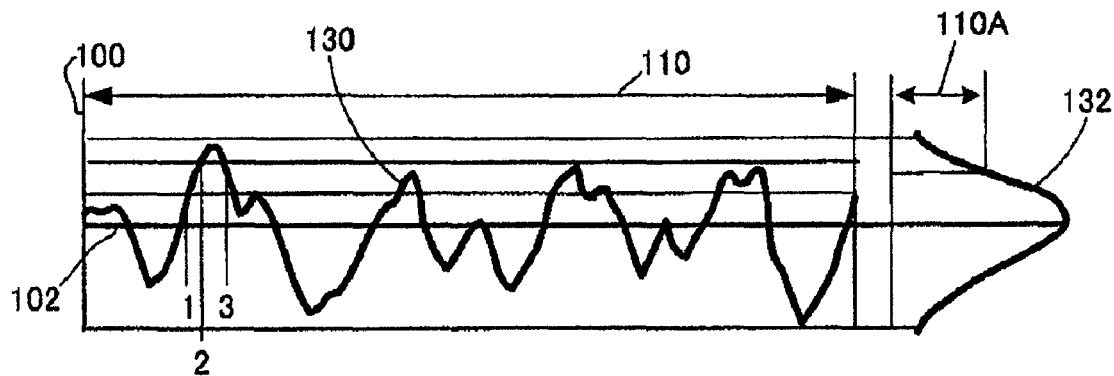
Fig. 6B
-- Prior Art --
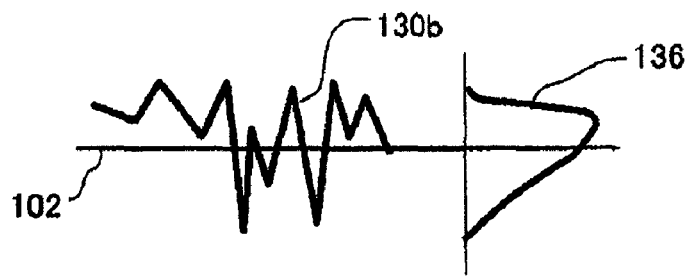
Fig. 6C
-- Prior Art --
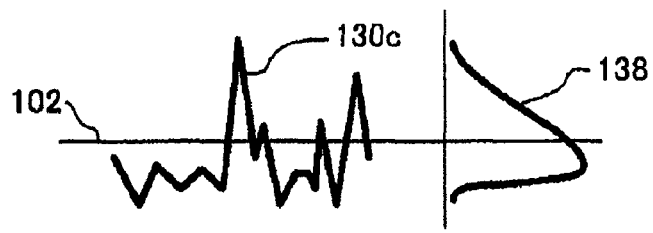
Fig. 6D
-- Prior Art --

[Before machining]

[After machining]

SILICON SINGLE CRYSTAL SUBSTRATE AND MANUFACTURE THEREOF

CROSS REFERENCE TO RELATED APPLICATIONS

This application is based upon and claims the benefits of priorities from Japanese Patent Application No. 2006-270065 filed on Sep. 29, 2006, the entire contents of which are incorporated herein by reference.

FIELD OF THE INVENTION

The present invention relates to a silicon single crystal substrate and a method of manufacturing the silicon single crystal substrate. More specifically, it relates to a silicon single crystal substrate utilized for growing an epitaxial layer from vapor and a method of manufacturing the substrate.

RELATED ART

In general, a silicon single crystal substrate is manufactured by adding dopants such as B (boron) as an acceptor, or P (phosphorus), As (arsenic), or Sb (antimony) as a donor to molten silicon (or silicon melt); pulling a silicon single crystal ingot from the silicon melt; slicing the silicon single crystal ingot to obtain silicon wafers; and etching and polishing surfaces of the silicon wafers. It is also known to manufacture a silicon wafer by an epitaxial method of growing a silicon single crystal layer from a vapor phase, not from a silicon melt. In such an epitaxial wafer, an epitaxial layer to which a low concentration (e.g., about $1 \times 10^{15}$ atoms/cm$^3$) of dopant is added may be formed on the above-mentioned silicon single crystal substrate to which a high concentration (e.g., $7 \times 10^{18}$ atoms/cm$^3$) of dopant is added.

If in order to manufacture an epitaxial wafer the above-mentioned silicon single crystal substrate to which the high concentration of dopant is added is heated at a high temperature in a hydrogen atmosphere so as to grow the epitaxial layer from the vapor phase, the high concentration of dopant added to the substrate may be released into the vapor phase since the back face of the silicon substrate is mainly etched by hydrogen. The dopant once released in the vapor may be incorporated again into the epitaxial layer growing as the raw materials are supplied from the vapor. This phenomenon may be called "auto-doping" and cause a nonuniform dopant concentration in the epitaxial layer. Therefore, conventionally, a protective layer made of silicon dioxide or silicon nitride is formed on the back face of the silicon single crystal substrate to prevent etching of the substrate by the hydrogen.

The protective layer can be formed on the back face of the silicon single crystal substrate, for example, by the CVD (chemical vapor deposition) method. However, during the CVD process, a protective layer (CVD layer) is also formed on the main face or the outer peripheral region of the silicon single crystal substrate because the source gas passes around into contact therewith. It has been proposed that the CVD layer formed on the main face and the outer peripheral region of the substrate by the source gas passing around into contact herewith is to be mechanically or chemically removed (Japanese patent No. 2757069), for example, by tape grinding (Japanese unexamined patent application publication No. H07-82997).

Here, the silicon single crystal substrate to be utilized for the above-mentioned epitaxial vapor phase growth may have particles thereon due to fracture of the peripheral region thereof. It should be under stood that it is also desirable for the formation of the epitaxial growth layer to reduce the number of particles caused by the fracture of the peripheral region. Therefore, it has also been proposed to form chamfered parts on the outer periphery of the wafer having the thickness of 't', with the chamfered parts being given an arc of a radius of about ½t and a part within 500 μm along the surface from the edge of the main mirror face being formed to have a mirror finished face with a maximum surface roughness (Rmax) not exceeding 0.5 μm (Japanese examined patent application publication No. H07-82997).

However, the above-mentioned proposals are utilized individually to achieve respective effects and the desired characteristics of the silicon single crystal substrate as a whole are not achieved. There is also a strong need to reduce the rate of occurrence of breakage or other failure while handling the silicon single crystal substrate since so many silicon single crystal substrates are handled in recent years.

Auto-doping can be prevented by, for example, tape-grinding off the CVD layer formed on the main surface and peripheral regions due to the passing around of the source gas, but it is not always possible to prevent the particle occurrence due to the fracture of the chamfered part around the peripheral parts. On the other hand, although it is possible to reduce the occurrence rate of particle generation to some extent by forming the chamfered parts around the peripheral regions of the silicon single crystal substrate in a mirror face with a maximum surface roughness (Rz) not exceeding 0.5 μm, it is not possible to effectively prevent the auto-doping by the dopant added to the silicon single crystal substrate in a high concentration.

Further, it is not easy to ensure sufficient strength of the silicon single crystal substrate if the surface roughness of the ground chamfered part is controlled to a mirror finish having a maximum surface roughness (Rz) of 0.5 μm or less.

SUMMARY OF THE INVENTION

In the present invention, a method of manufacturing a silicon single crystal substrate which can ensure sufficient strength of the silicon single crystal substrate, reduce the occurrence rate of particle generation, and effectively prevent the auto-doping in manufacturing an epitaxial wafer is provided.

In the present invention, a semiconductor wafer for epitaxial growth comprising: a main face on which a vapor phase epitaxial layer grows; a back face provided on an opposite side of the wafer; a main chamfered part along a circumferential edge where the main face and a side face of the wafer meet; and a back chamfered part along a circumferential edge where the back face and the side face meet is provided. After a CVD layer formation process is conducted to form a layer at least on the back face and the back chamfered part, a machining process is conducted on the main face to remove a CVD layer at least partially formed thereon so as to polish the main face to a mirror finished surface with a maximum height of profile (Rz) not exceeding 0.3 μm.

A method of manufacturing the epitaxial growth semiconductor wafer is also provided. The method comprises: forming a main chamfered part along a circumferential edge where the main face and the side face meet and a back chamfered part along a circumferential edge where the back face and the side face meet; forming a CVD layer at least partially on the main chamfered part or the back chamfered part; grinding the main chamfered part and the back chamfered part to remove the CVD layer; and finishing the main chamfered part and the back chamfered part into mirror finished surfaces with a maximum height of profile (Rz) on each face not exceeding 0.3 μm.

Further features of the present invention, its nature, and various advantages will be more apparent from the accompanying drawings and the following description of the preferred embodiment.

BRIEF DESCRIPTION OF THE DRAWINGS

FIG. 3 illustrates the definition of the maximum surface roughness or maximum height roughness Rz (JIS B O601-2001).

FIG. 4 illustrates the definition of the arithmetical mean deviation of the surface Ra (JIS B O601-2001).

FIGS. 6A to 6D illustrate the definition of amplitude distribution curve (ADC).

DETAILED DESCRIPTION OF THE PREFERRED EMBODIMENT

Figure 1A:
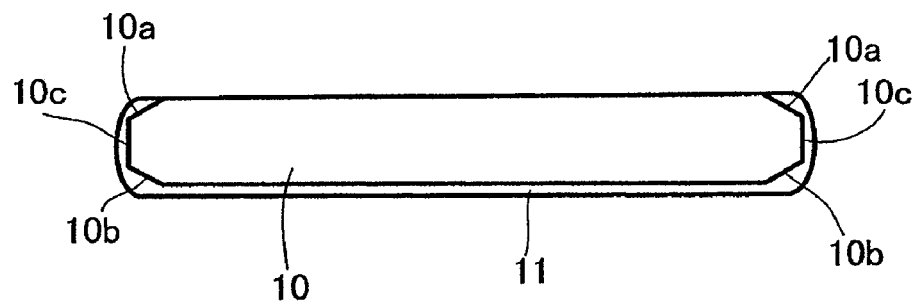
FIGS. 1A to 1C are cross section views of silicon single crystal substrates for vapor growth in accordance with an embodiment of the present invention.

The present invention will be explained in detail below with reference to an embodiment utilizing the drawings. Here, the same reference numeral is used for the same element throughout, and duplicated description is avoided.

Figure 1B:
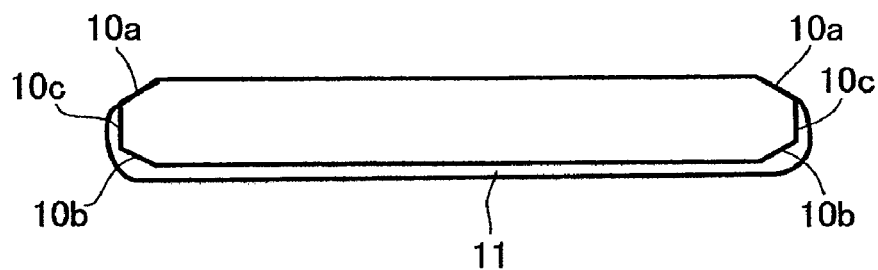
Figure 1C:
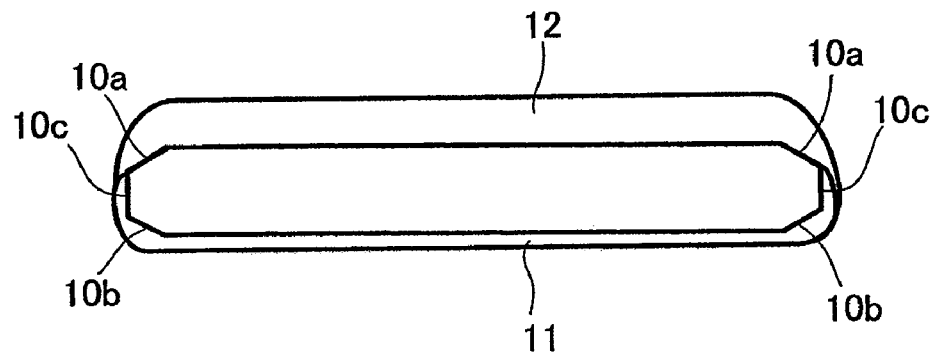

A method of manufacturing a single crystal silicon substrate for vapor phase growth will be described mainly using FIGS. 1A to 1C. A lapping-processed, n-type single crystal silicon substrate 10 is prepared. The substrate 10 has a diameter of 125 mm and a main crystal plane direction of (100), and is doped with $3 \times 10^{19}$ atoms/cm$^3$ arsenic. The concentration of a dopant added to a substrate for manufacturing a silicon wafer used for a power MOSFET for a switching power supply is preferably adjusted to within the range of $1 \times 10^{19}$ to $1.9 \times 10^{21}$ atoms/cm$^3$. In order to make ON resistance sufficiently low, a dopant concentration of $1 \times 10^{19}$ atoms/cm$^3$ or larger is required, but arsenic cannot be added in an amount of $1.9 \times 10^{21}$ atoms/cm$^3$ or more to a single crystal silicon.

Figure 2A:
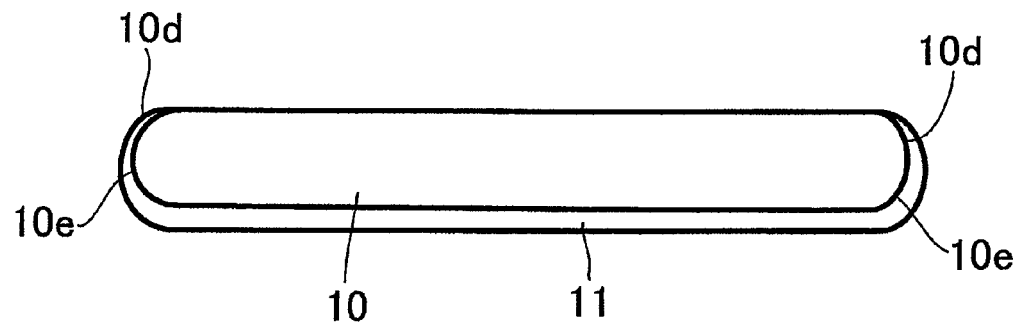
FIGS. 2A to 2C are cross section views of silicon single crystal substrates for vapor growth in accordance with another embodiment of the present invention.
Figure 2B:
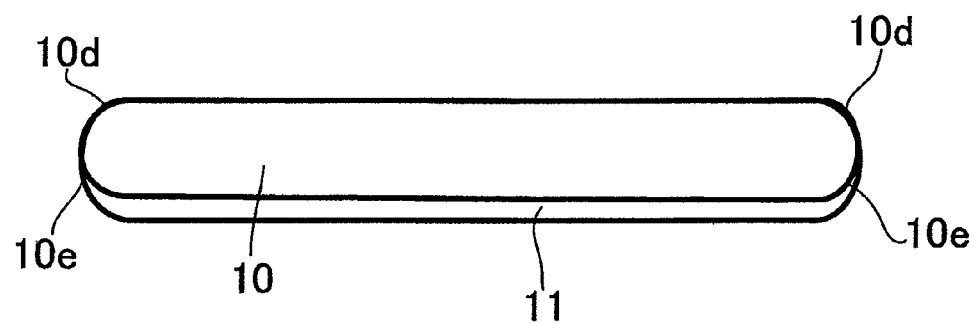
Figure 2C:
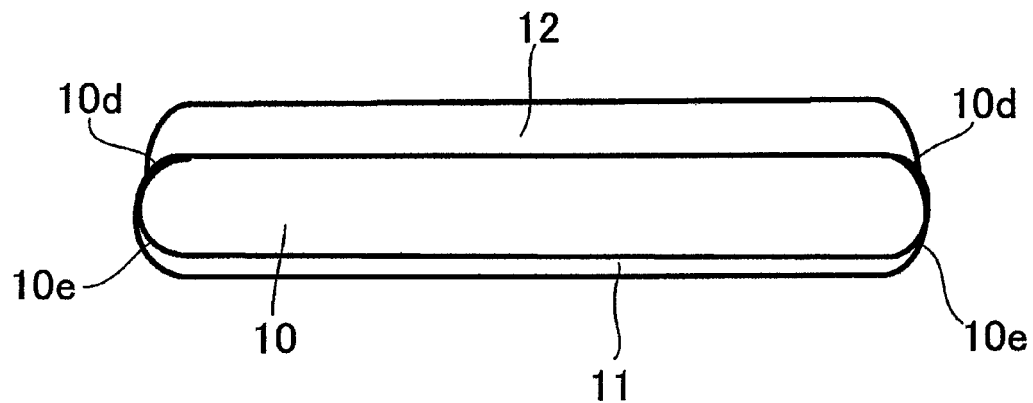

Next, the side surface of the prepared single crystal silicon substrate 10 after lapping is chamfered to form a main surface chamfered part 10a, an outer circumferential part 10c and a back surface chamfered part 10b (FIGS. 1A to 1C and 7A to 7D). The chamfered parts can optionally be formed in an arc shape as shown in FIGS. 2A to 2C as required. The chamfering can be performed before lapping.

After chemical etching for removing processing strain has been applied to the chamfered substrate 10, the substrate 10 is processed in a CVD apparatus to deposit, on the back-and side surfaces of the substrate 10, a CVD film 11 which is constituted of an oxide film and intended to prevent autodoping. The CVD apparatus used in the present example is of the continuous processing type in which, as the charged substrate 10 moves on, a raw material gas is jetted onto the substrate while the substrate is being heated to 300 to 500° C., to form a 300 to 12,000 nm-thick CVD film 11 on the substrate 10.

If monosilane (SiH4) is used as a raw material gas and caused to react with oxygen, a silicon dioxide (SiO2) film grows as the CVD film 11. Besides the type of the CVD apparatus used for the present example, there are other types, such as the horizontal type, vertical type and diffusion furnace type. In these apparatuses, a silicon dioxide (SiO2) film grows on the substrate as the CVD film 11 under a reduced pressure of 0.1 to 10 Torr while the substrate is being heated in a temperature range of 700 to 900° C.

When the CVD film 11 is grown on the chamfered substrate 10, the raw material gas not only reaches the rear surface of the substrate 10 but also flows around the substrate to reach the main surface side of the chamfered part. Therefore, the CVD film 11 grows to extend onto the chamfered part 10a of the main surface side. This state is shown in FIG. 1A.

Figure 8:
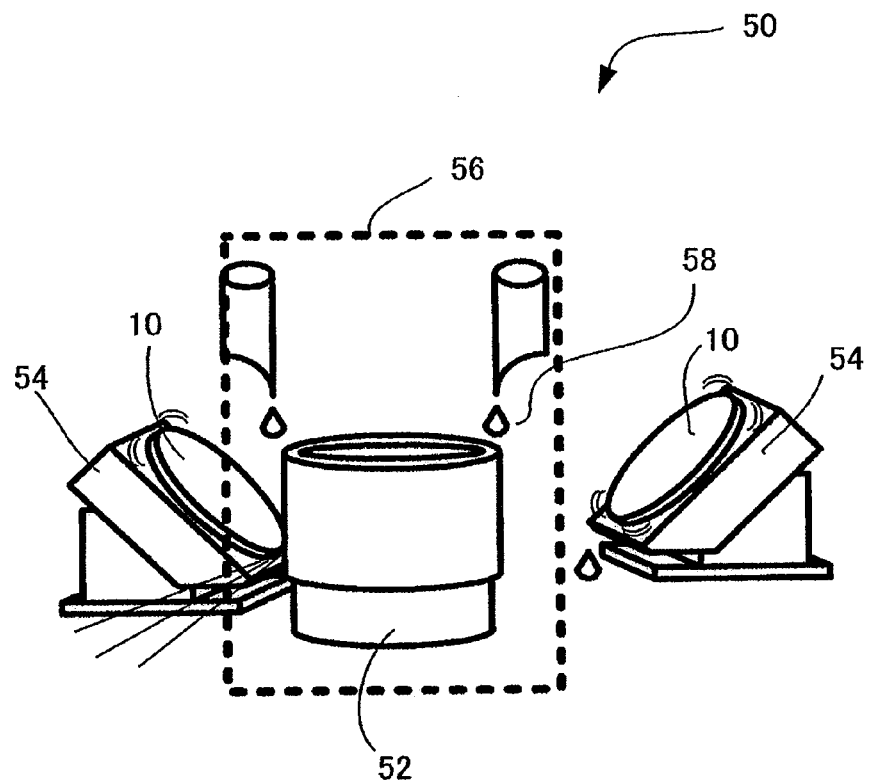
FIG. 8 is a schematic diagram showing a grinding machine which can be utilized in the present invention.

Then, the single crystal silicon substrate 10 on which the CVD film 11 has grown is removed from the CVD apparatus, and the portion of the CVD film 11 which has spread to, and grown on, the chamfered part 10a of the main surface side is removed using a polisher. This state is shown in FIG. 1B. The polishing can be applied using a polisher 50 as shown in FIG. 8. For example, a polishing drum 52 can be used which supports free abrasive grains of silicon oxide having a particle diameter of 10 to 60 μm. The substrate 10 is fixed with a lower chuck 54 and polished by pressing the substrate against the polishing drum 52 placed within a drum cover 56. A polishing liquid which contains a suitable abrasive is supplied as slurry 58. The substrate 10 fixed with the lower chuck 54 is rotated at 500 to 900 rpm, and the portion of the CVD film 11 which has spread to, and grown on, the chamfered part 10a of the main surface side is pressed against the polishing drum.

When the diameter of fixed abrasive grains is larger than 9 μm in this case, it is preferable to remove strain by etching using an alkaline aqueous solution, such as a KOH solution, after the polishing. On the other hand, when the diameter of the fixed abrasive grains is smaller than 3 μm, a long period of time is needed for the polishing, which is not practical. If the number of rotation of the substrate 10 is 500 to 900 rpm, the polishing can be completed in 30 to 300 seconds per wafer.

After the portion of the CVD film 11 which has spread to, and grown on, the chamfered part 10a of the main surface side has been removed from the single crystal silicon substrate 10, the main surface of the single crystal silicon substrate 10 is mirror-polished by a mechanochemical method, to thereby obtain a single crystal silicon substrate for vapor phase growth.

If an epitaxial layer 12 to which phosphorus (P) is added in a concentration of $1 \times 10^{16}$ atoms/cm$^3$ as a dopant is grown to a thickness of 6 μm by vapor phase growth on the thus-obtained single crystal silicon substrate for vapor phase growth, the epitaxial layer 12 is formed on the main surface and on the chamfered part 10a of the main surface side of the single crystal silicon substrate 10. This state is shown in FIG. 1C. Since the CVD film which has spread to, and grown up on, the chamfered part 10a of the main surface side of the single crystal silicon substrate for vapor phase growth has been removed thoroughly by polishing, no nodules are found in any single substrate. Further, no defects which originate from processing strain, such as stacking faults and slippage, are generated. Since the CVD film on the other chamfered parts 10b and 10c and on the back surface is reliably left intact, auto-doping can be substantially prevented. On the other hand, if the epitaxial layer 12 is deposited by vapor phase growth without removing the CVD film which has spread to, and grown on, the chamfered part 10a of the main surface side, nodules are formed on the chamfered part 10a of the main surface side.

As another example, FIGS. 2A to 2C shows a case of removing, by means of tape polishing, a CVD film which has spread to, and grown on, the side surface of the main surface side, that is, the side surface which is visible from the main surface side, of a single crystal silicon substrate 10, the side surface of which is formed into an arc shape. Also in this case, since the CVD film 11 which has spread to the side surface of the main surface side 10d (FIG. 2A) is thoroughly removed by polishing (FIG. 2B), no nodules are formed even if the epitaxial layer 12 is grown by vapor phase growth, and the auto doping can also be substantially prevented (FIG. 2C).

Figure 7A:
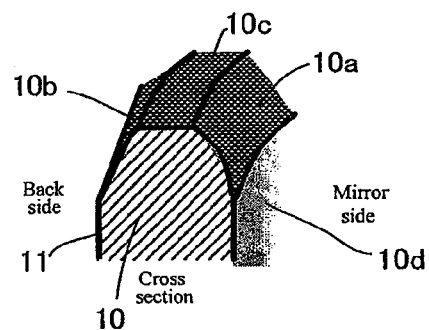
FIGS. 7A to 7D are perspective views of the chamfered parts of silicon single crystal substrates.
Figure 7B:
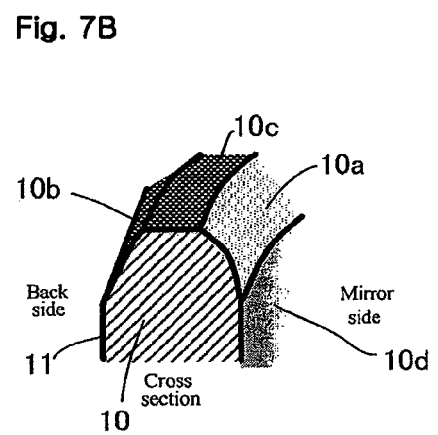
Figure 7C:
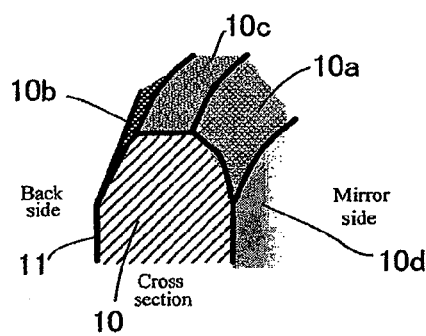
Figure 7D:
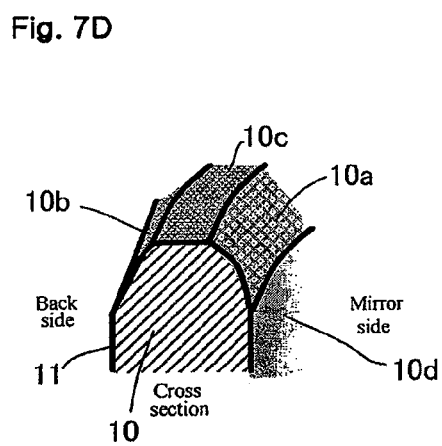

Mirror finishing of the chamfered part, and the like, will be further explained with reference to FIGS. 7A to 7D. FIG. 7A shows the state before mirror finishing. FIG. 7B shows the state where the CVD film 11 is removed from only the chamfered part 10a by polishing and mirror finishing is applied thereto. FIG. 7C shows the state where the CVD film 11 is removed from the chamfered part 10a and outer circumferential side surface 10c by polishing and mirror finishing is applied thereto. FIG. 7D shows the state where the CVD film 11 is removed from the chamfered part 10a, outer circumferential side surface 10c and chamfered part 10b on the back side by polishing and mirror finishing is applied thereto.

It is more desirable to maintain the CVD film 11 since the CVD film 11 can prevent auto-doping effectively. However, in order to prevent crowning and the like, in the circumferential edge part of the epitaxial layer, at least the CVD film of the chamfered part 10a on the side of the mirror plane is removed. Moreover, depending on the conditions of epitaxial growth, it is more preferable to also remove the CVD film 11 on the outer circumferential side surface 10c and to form the outer circumferential side surface 10c into a mirror plane. This is because removal of the CVD film 11 has an inhibiting effect on the auto-doping prevention but the adverse effect of particle generation may be more serious than the auto-doping. Further, it is not so desirable to remove the CVD film 11 on the chamfered part 10b on the back side, because the ill effect of auto-doping increases.

Figure 9:
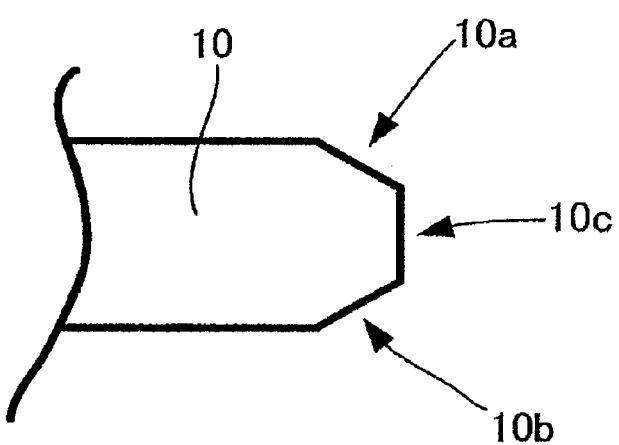
FIG. 9 is a partial cross section view of a silicon single crystal substrate 10.

FIGS. 9 to 15 show a single crystal silicon substrate 10 of which the chamfered part 10a on the side of the mirror plane and the outer circumferential side surface 10c are actually formed into a mirror plane, and further show the evaluation results of the substrate 10. FIG. 9 shows a cross section of the single crystal silicon substrate 10. The thickness of the silicon substrate is roughly 520 μm, and chamfering on the side of the mirror plane was performed at an angle of about 10 to 30 degrees for a part in a range of approximately 100 to 500 μm from the circumferential edge of the substrate. Chamfering of the back surface side was performed in an angle of about 10 to 30 degrees for a part in a range of approximately 100 to 500 μm from the circumferential edge of the substrate. The surfaces of the chamfered parts 10a and 10b had a rounded shape of a radius of 100 to 500 μm.

Figure 10A:
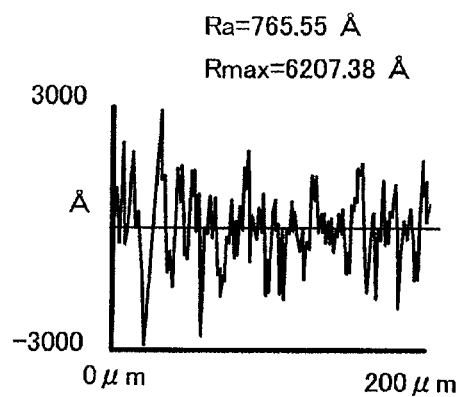
FIGS. 10A and 10B are views showing profile curves of surfaces of chamfered parts 10a and 10c of a comparative example.
Figure 10B:
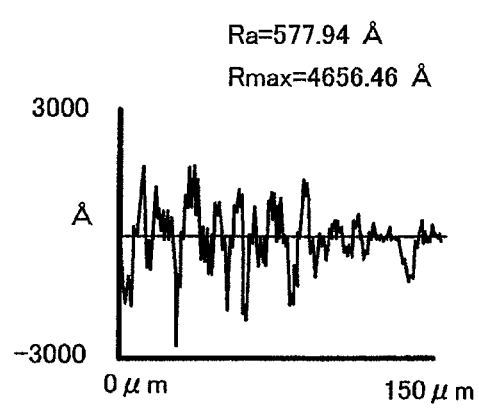

FIGS. 10A and 10B show, as a comparative example, roughness curves measured for chamfered parts finished as a smooth plane in the usual manner. FIGS. 10A and 10B show the roughness curves of the surfaces of the chamfered parts 10a and 10c, respectively. The maximum heights Rmax (equivalent to Rz) of the above sample were 0.621 μm and 0.466 μm, respectively. Moreover, the arithmetic means of the roughness Ra were 0.077 μm and 0.058 μm, respectively.

Figure 11A:
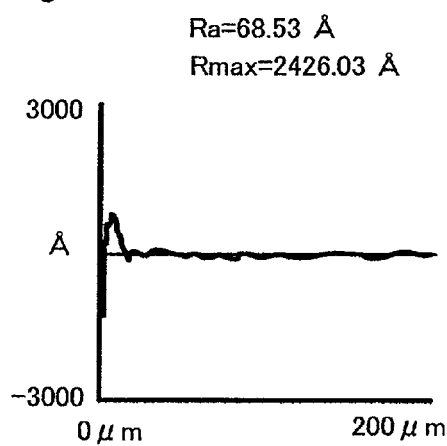
FIGS. 11A and 11B are views showing profile curves of surfaces of chamfered parts 10a and 10c of an embodiment.
Figure 11B:
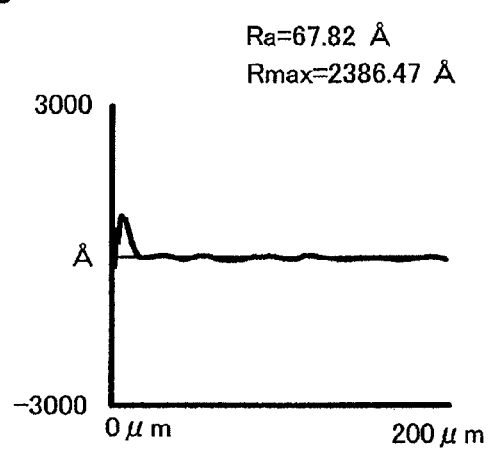
Figure 12:
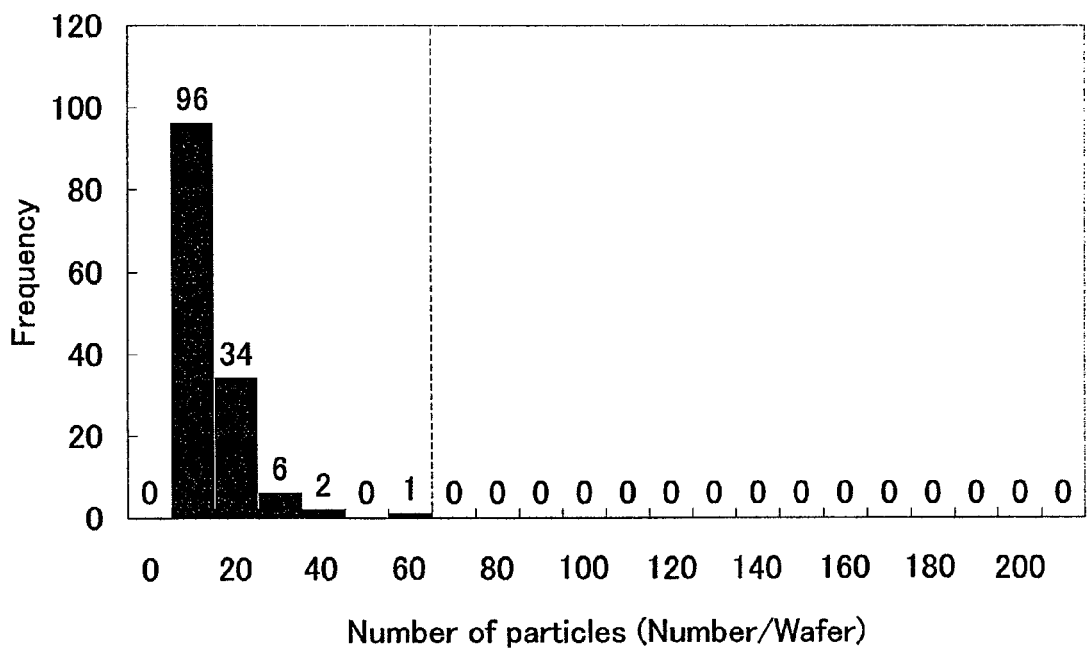
FIG. 12 is a view showing the state of particle generation in an embodiment.
Figure 13:
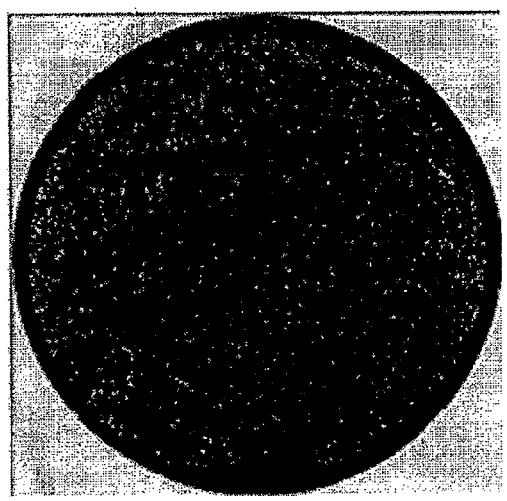
FIG. 13 is a view showing the state of particle generation in an embodiment.
Figure 14:
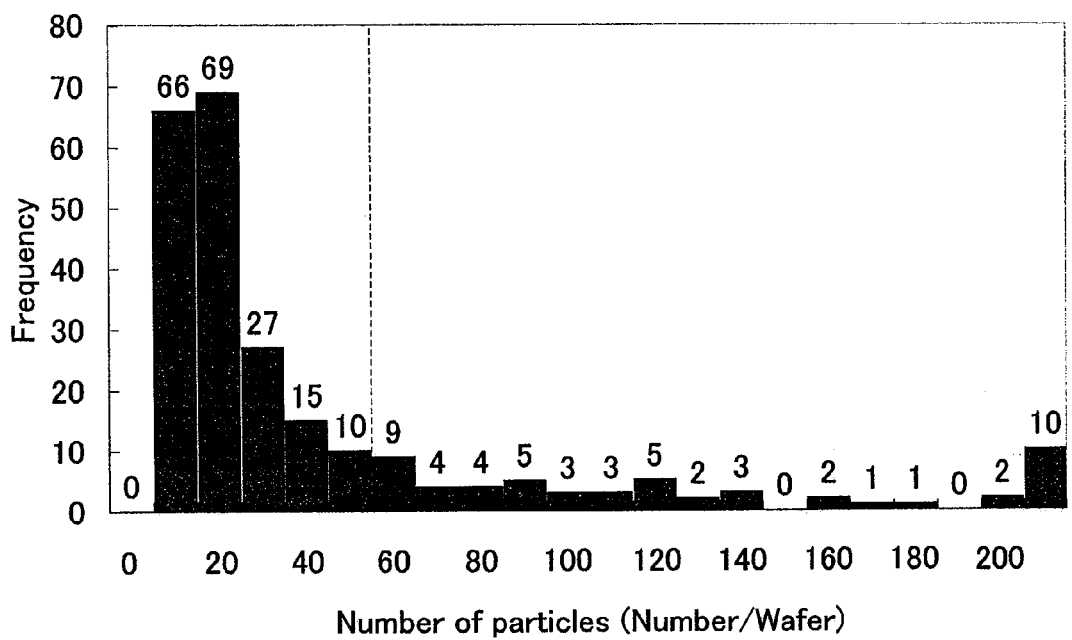
FIG. 14 is a view showing the state of particle generation in a comparative example.
Figure 15:
FIG. 15 is a view showing the state of particle generation in a comparative example.

FIGS. 11A and 11B show, as an example, roughness curves measured for mirror-finished surfaces according to the present invention. FIGS. 11A and 11B show the roughness curves of the surfaces of the chamfered parts 10a and 10c, respectively. The maximum heights Rmax (equivalent to Rz) of the above sample were 0.243 μm and 0.239 μm, respectively. Moreover, the arithmetic means of the roughness Ra were 0.0069 μm and 0.0068 μm, respectively. The peak position of each amplitude distribution curve (ADC) was higher than a mean line.

Next, FIGS. 12-13, and 14-15 show the results of investigations into the distribution and number of particles which were generated from the above-mentioned single crystal silicon substrates of the example and the comparative example, respectively. Occurrence of particles having a particle diameter equal to or larger than 0.1 μm was hardly observed in the single crystal silicon substrate according to the example. On the other hand, a considerable number of particles (the grain size being equal to or larger than 0.1 μm) arose from the single crystal silicon substrate of the comparative example, and the relative ratio was about 1 to 5. These figures clearly show that there was a smaller number of countable particles in the present example.

When a comparison was made using a predetermined intensity index, the single crystal silicon substrate of the example showed an intensity 1.3 times the intensity of the comparative example.

Further, a silicon wafer and a method of manufacture thereof as described below may be provided in accordance with the present invention.

(1) A semiconductor wafer for epitaxial growth comprising: a main face on which a vapor phase epitaxial layer grows; a back face provided on an opposite side of the wafer; a main chamfered part along a circumferential edge where the main face and a side face of the wafer meet; and a back chamfered part along a circumferential edge where the back face and the side face meet is provided. After a CVD layer formation process is conducted to form a layer at least on the back face and the back chamfered part, a machining process is conducted on the main face to remove a CVD layer at least partially formed thereon so as to polish the main face to a mirror finished surface with a maximum height of profile (Rz) not exceeding 0.3 μm.

Here, the maximum surface roughness (Rz) is based on JIS B 0601-2001 and the measurement length is 0.2 mm.

(2) The semiconductor wafer according to the above (1) wherein a machining process is conducted on the side face to remove a CVD layer at least partially formed thereon so as to polish the side face to a mirror finished surface with a maximum height of profile (Rz) not exceeding 0.3 μm.

Here, the mirror finish on the chamfered parts can be made by a grinding device utilizing a grinding drum. The outer side face also can be finished into a mirror face with the same device. The order in which the parts are finished into a mirror face with the grinding device is arbitrary. And it is possible instead to simultaneously process the parts little by little.

(3) The semiconductor wafer according to the above (1) or (2) wherein a machining process is conducted on the main chamfered part to remove a CVD layer at least partially formed thereon so as to polish the main chamfered part to a mirror finished surface wherein a maximum height of profile (Rz) does not exceed 0.3 µm; wherein an average roughness (Ra) does not exceed 0.01 µm; and wherein a skewness of surface height distribution is positive.

Here, the particle generation caused by fracture or chipping may be affected not only by the scale of the surface roughness, but also by the shape (e.g., the amplitude distribution curve of the roughness).

(4) The semiconductor wafer according to any one of the above (1) to (3) wherein a machining process is conducted on the side face to remove a CVD layer at least partially formed thereon so as to polish the side face to a mirror finished surface wherein a maximum height of profile (Rz) does not exceed 0.3 µm; wherein an average roughness (Ra) does not exceed 0.01 µm; and wherein a skewness of surface height distribution is positive.

(5) A method of manufacturing an epitaxial growth semiconductor wafer having a main face, a back face on an opposite side, and a side face between the main face and the back face is provided. The method comprises: forming a main chamfered part along a circumferential edge where the main face and the side face meet and a back chamfered part along a circumferential edge where the back face and the side face meet; forming a CVD layer at least partially on the main chamfered part or the back chamfered part; grinding the main chamfered part and the back chamfered part to remove the CVD layer; and finishing the main chamfered part and the back chamfered part to mirror finished surfaces with a maximum height of profile (Rz) on each face not exceeding 0.3 µm.

(6) The method according to above (5) further comprising: grinding off the CVD layer on the side face; and finishing the side face to a mirror finished surface with a maximum height of profile (Rz) not exceeding 0.3 µm.

(7) The method according to the above (5) or (6) wherein a maximum height of profile (Rz) on the main chamfered part does not exceed 0.3 µm; wherein an average roughness (Ra) does not exceed 0.01 µm; and wherein a skewness of surface height distribution is positive.

(8) The method according to the above (6) wherein a maximum height of profile (Rz) on the side face does not exceed 0.3 µm; wherein an average roughness (Ra) does not exceed 0.01 µm; and wherein a skewness of surface height distribution is positive.

The method of evaluating the surface roughness will be briefly explained with reference to FIGS. 3 to 6A-6D. FIG. 3 illustrates the definition of the maximum surface roughness or maximum height roughness [Rz (JIS B O601-2001) or Ry (JIS B O601-1994) or Rmax (JIS B O601-1982)]. In FIG. 3, the roughness curve 104 is depicted as the roughness measurement is being scanned for a standard length L (110) from the vertical axis 100 which shows the height of the roughness. Here, a predetermined cutoff value is utilized to remove the waviness component. The maximum height (Ry) is a summation of the height Yp of the highest summit (height 106) and the depth Yv of the deepest valley (depth 108) from the average line 102 of the roughness curve 104.

$$Ry = Yp + Yv \qquad \text{[Equation 1]}$$

As shown in the figure, the value tends to be large if there is even one extremely high mountain or deep valley such that the measurement values tend to have a large deviation.

FIG. 4 illustrates the definition of the arithmetical mean deviation of the surface [Ra (JIS B O601-2001)]. Similarly, the roughness curve 104 is drawn as the surface is being scanned for a standard length L (110) for the roughness measurement from the vertical axis which indicates the height direction of the roughness. In this case, a predetermined cut-off value can be used to remove the waviness component. The arithmetical mean deviation of the surface 112 (Ra) is obtained by averaging the accumulated absolute deviations from the average line 102 to the measured curve 104.

[Equation 2]

$$Ra = \frac{1}{l} \int_0^l |f(x)| dx$$

As shown in this figure, a steady result tends to be obtained since the influence on the measured value is extremely small even if one extremely high mountain or deep valley, for example.

Figure 5A:
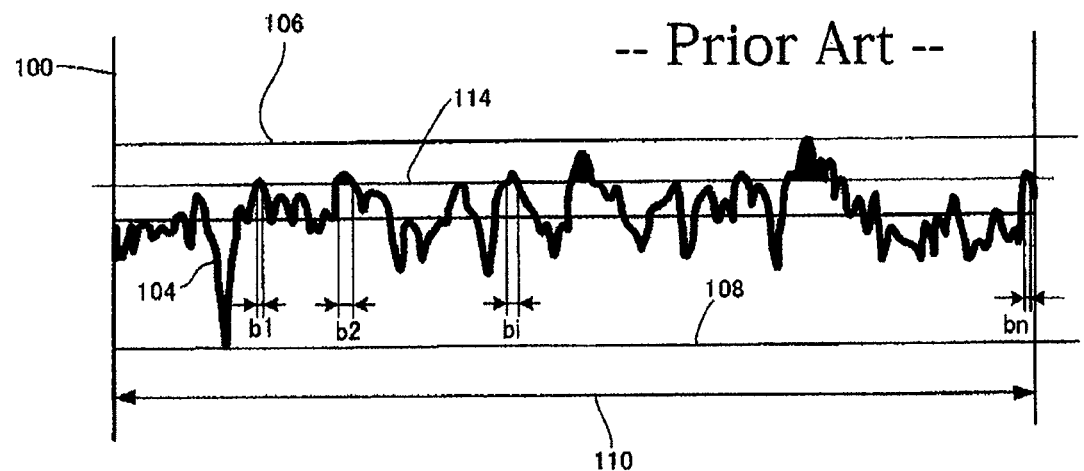
FIGS. 5A to 5F illustrate the definition of a bearing ratio (tp) and a bearing ratio curve (BAC).
Figure 5B:
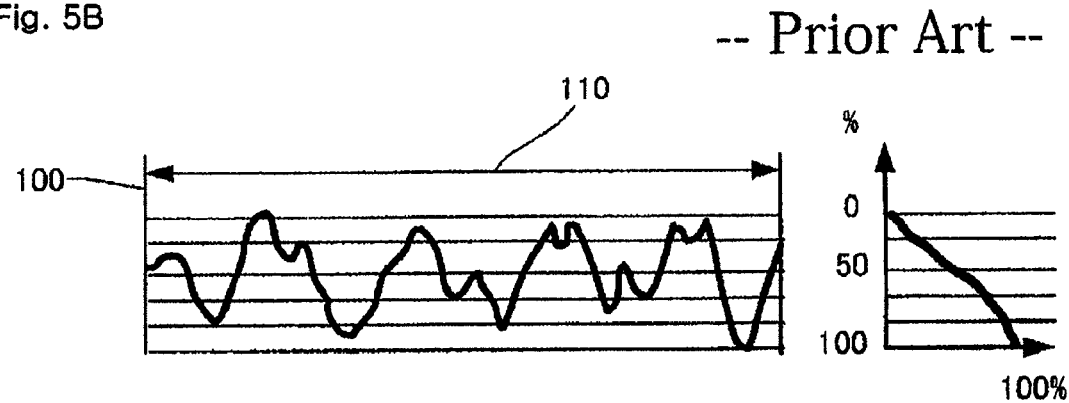
Figure 5C:
Figure 5D:
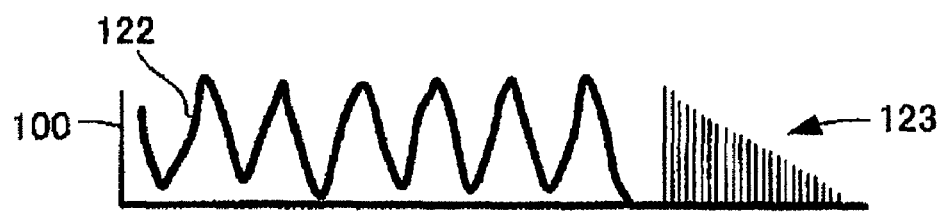
Figure 5E:
Figure 5F:
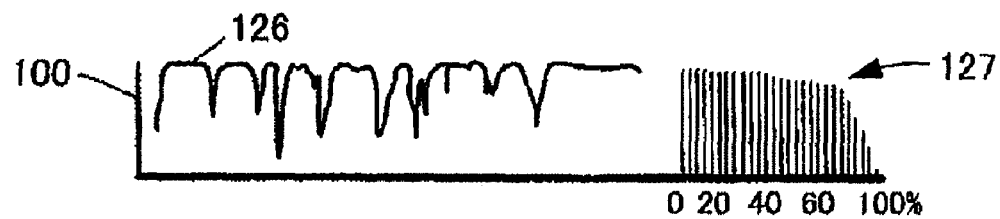

FIG. 5A illustrates the definition of the bearing ratio tp. The bearing ratio is given by dividing the summation of cut length obtained, when the roughness curve 104 is cut by a cutting line 114 parallel to the summit line 106, by the standard length L (110) and the ratio is expressed in percentage.

[Equation 3]

$$tp = \frac{np}{l} \times 100$$

$$np = b1 + b2 + b3 + \ldots + bn \qquad \text{[Equation 4]}$$

l=Reference length

Generally, it is widely used for evaluating friction properties such as wear resistance.

FIGS. 5A to 5F illustrate the definition of the bearing ratio curve (BAC). The bearing curve (BAC) is obtained by plotting the direction of the measurement height (cutting height) in the vertical axis against the above-mentioned bearing ratio tp in the horizontal axis. FIGS. 5A to 5F illustrate the bearing curve (BAC) 121, 123, 125, and 127 in (c) to (f) obtained from respective curves 120, 122, 124, and 126. In the case where the roughness curve 122 shows mountains and valleys evenly from the average line, the graph tends to show a curve lower on the right side (123). In the case where the roughness curve 120 depicts a projection on the surface, the curve suddenly drops on the right side and later the curve shows gradual decline (121). Also, in the case where a crack is made from the flat face, the curve shows a gradual decline toward the right and suddenly drops (127). From this, it is considered that the roughness as shown in (f) is desired to prevent particle generation effectively.

FIGS. 6A to 6D illustrate the definition of the amplitude distribution curve ADC. The amplitude distribution curve ADC (a1) is given by plotting the height direction of the roughness curve against the ratio of the number 'n' of data existing in an area between two parallel lines which define an evenly divided fraction between the highest summit and the deepest valley of the roughness curve 130 to the number 'N' of total data. FIGS. 6A to 6D show respective amplitude distribution curves (ADC) for various roughness curves 130a, 130b, and 130c, respectively. The peak positions 134, 136, 138 of the respective amplitude distribution curves (ADC) are located at almost the same height of the average line, at higher positions than the average line, and at lower positions than the average line. From these figures, it is considered that the roughness as shown in FIG. 6C may be desirable to prevent particle generation. Here, the above-mentioned bearing curve (BAC) is a curve given by accumulating values on the horizontal axis (ratio of n to N) of the amplitude distribution curve ADC.

As described above, the roughness is defined in various ways, and each parameter shows individual characteristic, so that it is preferable to combine these parameters to evaluate the properties.

As described above, it is possible to prevent auto-doping effectively, reduce particle generation, and ensure sufficient strength of the silicon single crystal substrate.

The present invention made by the present inventor is described in the foregoing. It is needless to say, however, that the present invention is not limited to the above embodiments and may be altered in various ways without departing from the spirit of the present invention.

What is claimed is:

1. A method of manufacturing an epitaxial growth semiconductor wafer having a main face, a back face on an opposite side, and a side face between the main face and the back face, the method comprising:
    forming a main chamfered part along a circumferential edge where the main face and the side face meet and a back chamfered part along a circumferential edge where the back face and the side face meet;
    forming a chemical vapor deposition (CVD) layer at least partially on the main chamfered part or the back chamfered part;
    grinding the main chamfered part and the back chamfered part to remove the CVD layer; and
    finishing the main chamfered part and the back chamfered part to be mirror finished surfaces with a maximum height of profile (Rz) on each face not exceeding 0.3 μm such that fracture and chipping on the surfaces are prevented.

2. The method according to claim 1 further comprising:
    grinding off the CVD layer on the side face; and
    finishing the side face to be a mirror finished surface with a maximum height of profile (Rz) not exceeding 0.3 μm such that fracture and chipping on the surfaces are prevented.

3. The method according to claim 1 wherein a maximum height of profile (Rz) on the main chamfered part does not exceed 0.3 μm, wherein an average roughness (Ra) does not exceed 0.01 μm and wherein a skewness of surface height distribution is positive.

4. The method according to claim 2 wherein a maximum height of profile (Rz) on the side face does not exceed 0.3 μm, wherein an average roughness (Ra) does not exceed 0.01 μm and wherein a skewness of surface height distribution is positive.

* * * * *